United States Patent
Brabetz et al.

(10) Patent No.: US 7,321,263 B2
(45) Date of Patent: Jan. 22, 2008

(54) CLASS E POWER AMPLIFIER CIRCUIT AND ASSOCIATED TRANSMITTER CIRCUITS

(75) Inventors: Thorsten Brabetz, Belfast (GB); Vincent Francis Fusco, Belfast (GB)

(73) Assignee: Queen's University of Belfast, Belfast (GB)

( * ) Notice: Subject to any disclaimer, the term of this patent is extended or adjusted under 35 U.S.C. 154(b) by 5 days.

(21) Appl. No.: 11/065,640

(22) Filed: Feb. 24, 2005

(65) Prior Publication Data
US 2005/0218977 A1   Oct. 6, 2005

(30) Foreign Application Priority Data
Feb. 25, 2004   (GB) .................... 0404121.6

(51) Int. Cl.
H03F 3/38   (2006.01)
(52) U.S. Cl. .............. 330/10; 330/251; 330/207 A
(58) Field of Classification Search ............ 330/10, 330/251, 207 A
See application file for complete search history.

(56) References Cited

U.S. PATENT DOCUMENTS

| | | | |
|---|---|---|---|
| 4,717,884 A * | 1/1988 | Mitzlaff .................... 330/251 |
| 5,276,912 A | 1/1994 | Siwiak et al. ............... 455/73 |
| 5,535,438 A * | 7/1996 | Sevic ........................ 455/110 |
| 5,926,093 A | 7/1999 | Bowers et al. ........... 340/572.1 |
| 5,939,941 A * | 8/1999 | Nair et al. .................. 330/251 |
| 6,232,841 B1 | 5/2001 | Bartlett et al. .............. 330/305 |
| 6,724,255 B2 * | 4/2004 | Kee et al. ................... 330/251 |
| 6,816,016 B2 * | 11/2004 | Sander et al. ............... 330/295 |
| 6,977,546 B2 * | 12/2005 | Stapleton .................... 330/10 |
| 7,046,088 B2 * | 5/2006 | Ziegler ....................... 330/251 |

OTHER PUBLICATIONS

Carrara, F., et al.: Institute of Electrical and Electronics Engineers: "High Performance Silicon Bipolar Power Amplifier for 1.8 GHZ Applications." 2002 IEEE MTT-S International Microwave Symposium Digest. (IMS 2002). Seattle, WA, Jun. 2-7, 20002, IEEE MTT-S, International Microwave Symposium, New York, NY: IEEE US, vol. 2 of 4, Jun. 2, 2002, pp. 1015-1018.

Davis, J. F., et al.: "A low-cost class-E amplifier with sine-wave drive." Microwave Symposium Digest, 1998 IEEE MTT-S International Baltimore, MD, USA, Jun. 7-12, 1998, New York, NY, USA, IEEE, US, vol. 2, Jun. 7, 1998, pp. 1113-1116.

(Continued)

Primary Examiner—Patricia Nguyen
(74) Attorney, Agent, or Firm—Drinker, Biddle & Reath LLP

(57) ABSTRACT

A class E power amplifier circuit comprising an active device, a DC blocking element and an oscillating element, wherein the oscillating element is driven by a voltage signal.

16 Claims, 11 Drawing Sheets

OTHER PUBLICATIONS

Deshpande, M., et al.: "Heterojunction Interband Tunneling Fets: Optimization and Use in Amplifier Circuits." Compound Semiconductors 1999. Proceedings of the 26th International Symposium on Compound Semiconductors. Berlin, Aug. 22-26, 1999, Institute of Physics Conference Series, London: IOP, GB, vol. NR. 166, Aug. 22, 1999, pp. 351-354.

Gupta, R., et al.: "Fully Monolithic CMOS RF Power Amplifiers: Recent Advances." IEEE Communications Magazine, IEEE Service Center. Piscataway, NJ US, vol. 37, No. 4, Apr. 1999, pp. 94-98.

Raab, F.H., et al.: "Class-F Power Amplifiers With Maximally Falt Waveform." IEEE Transactions on Microwave Theory and Techniques, IEEE, Inc., New York, US, vol. 45, No. 11, Nov. 1997, pp. 2007-2012.

Tan, Y., et al.: "A 900-MHZ Fully Integrated SOI Power Amplifier for Single-Chip Wireless Transceiver Applications." IEEE Journal of Solid-State Circuits, IEEE Inc., New York, US, vol. 35, No. 10, Oct. 2000, pp. 1481-1486.

* cited by examiner

Channel:   1CH   Frequency :   870.000000MHz

CLASS E POWER AMPLIFIER CIRCUIT AND ASSOCIATED TRANSMITTER CIRCUITS

The present invention relates to an amplifier circuit and in particular, a class E power amplifier circuit and its associated transmitter circuits.

BACKGROUND OF THE INVENTION

1. Role of High Added Power Efficiency Amplifiers in Mobile Telecommunications Equipment The rapid growth of the mobile telecommunications industry has created an increased demand for low-cost, low-power and lightweight equipment. Since mobile phones are essentially battery-operated devices, the amount of time that a mobile phone can be used before requiring recharging will be largely dependent on the power consumption of its transceiver circuitry.

In general, the power consumption of the oscillator and filter components of a transceiver circuit is negligible compared with that of the circuit's RF power amplifier. Consequently, the growing demands of the mobile telecommunications industry have focussed attention on the design and in particular the power efficiency of RF power amplifiers.

The efficiency of a power amplifier can be increased by minimising its power dissipation whilst ensuring that the output power is maintained at the desired level. However, it should be noted that the instantaneous power consumed by an active device is defined as the product of the drain-to-source voltage and drain-to-source current at any given point in time. Switching power amplifiers increase their efficiency by ensuring that a non-zero voltage does not exist across the amplifier at the same time that a non-zero current is flowing through the amplifier. In other words, switching power amplifiers ensure that either the voltage across the amplifier and/or the current flowing through the amplifier is zero at any given point in a RF cycle. Consequently, the product of the voltage and the current is zero at all times and in an ideal case no power is consumed by the device (i.e. all the DC input power to the power amplifier is converted to RF power and the DC-to-RF frequency of the amplifier is 100%). This functionality is essentially achieved through a switching operation that is inherently non-linear in character. The class E power amplifier is a well-known switching power amplifier.

2. Traditional Class E Power Amplifiers (a) Circuit Structure

FIG. 1 is an equivalent circuit diagram for a conventional class E power amplifier. The circuit comprises an active device (e.g. a bipolar junction transistor (BJT), heterojunction bipolar transistor (HBT), junction field-effect transistor (JFET), metal-oxide-silicon field-effect transistor (MOSFET) or metal semiconductor field effect transistor (MESFET)), a RF choke 1 and surrounding passive elements that form a load network.

Unlike conventional linear amplifiers (where the output of the active device varies smoothly in proportion with the input signal), the active device in a class E power amplifier operates as a switch having two discrete states, namely ON and OFF. Bearing this in mind, the active device in FIG. 1 is represented by a switch 2. The opening and closing of the switch 2 is controlled by a RF input signal (not shown).

During the ON state the switch 2 is closed and acts as a low resistance element which permits current to flow through it. During the OFF state the switch 2 is open and thus acts as a high impedance element capable of withstanding a voltage rise across its terminals. The operation of the switch 2 stimulates oscillation in a moderate-Q series resonant circuit 3 (comprising an inductor $L_s$ and a capacitor $C_s$) which is tuned to the fundamental frequency of the switching waveform. The oscillation of the resonant circuit 3 forces a sinusoidal current through a load resistor $R_L$, which results in a sinusoidal output signal $i_\theta$. The flow of a constant current throughout an entire RF cycle is ensured by applying a sufficiently large DC bias signal ($v_{DC}$) to the active device through the RF choke 1. The RF choke 1 typically has a very large inductance and thus only allows a DC current to pass through it.

A shunt capacitor $C_p$ is connected in parallel with the active device (switch 2). The task of the shunt capacitor $C_p$ is to act as a temporary energy store while the switch 2 is open thereby allowing the resonant circuit 3 to carry on oscillating even when the switch 2 is closed (i.e. all the current is flowing through the switch 2).

(b) Modes of Operation (i) OFF State Operation

During the OFF state (switch 2 open), the DC current $v_{DC}$ and the output current $i_\theta$ flows through the shunt capacitor $C_p$ (i.e. forming current $i_c$). This current charges the shunt capacitor $C_p$, resulting in a non-zero voltage $v_c$ (not shown). During the negative half-swing of the output current $i_\theta$, the current into the shunt capacitor ($i_c$) becomes negative and discharges the shunt capacitor $C_p$. If the switch timing and the capacitance of the shunt capacitor $C_p$ are chosen correctly the shunt capacitor $C_p$ is fully discharged (i.e. there is no voltage across the output terminals of the active device) by the time the switch 2 opens.

(ii) ON State Operation

During the ON state, the voltage across the switch 2 is zero (in the ideal case) and the current flows entirely through the switch 2 (i.e. thereby forming $i_{sw}$).

Consequently, at no time during the operation of the amplifier is a current flowing through the switch 2 and a voltage dropped across the switch 2. Consequently, the amplifier circuit consumes no energy and is ideally 100% DC-to-RF efficient.

In a real class E amplifier the switch timing is set via the gate bias and the voltage over the shunt capacitor Cp can be determined through the following equation.

$$i_c(t) = \frac{dv_c(t)}{dt}$$

(c) Problems with Conventional Class E Power Amplifiers

In spite of its obvious advantages, the mobile telecommunications industry has so far been slow to adopt the class E power amplifier. This stems from the inherent sensitivity of the amplifier to parasitic resistances existing within the active device, especially drain-to-source channel resistance. Class E power amplifiers have mainly been used to date to amplify lower frequency VHF signals where the parasitic resistance of the active device is not as problematic.

Class E amplifiers are inherently sensitive to these parasitic resistances because the currents flowing through the active device are relatively high. Consequently, even small parasitic resistances cause a significant voltage drop across the active device that interferes with the operation of the circuit during switching. This effect is particularly pronounced when operating at high frequencies.

As a consequence, with few exceptions all microwave designs to date have used heterojunction bipolar transistors (HBTs) as active devices, since their collector resistances are smaller (by about a factor of 10) than the drain-source resistance of a typical pseudomorphic high electron mobility transistor (pHEMT) with 100 μm gate width (R. E. Anholt, *Electrical and thermal characterization of MESFETs, HEMTs, and HBTs*. Norwood, Mass., USA: Artech House, Inc., 1995). In addition, the on conductance of a pHEMT drain varies with the gate width, further complicating the design process of the class E power amplifier.

The few pHEMT-based class E amplifier designs published to date use very large devices with total gate widths in the range 1 mm (*IEEE Radio Frequency Integrated Circuits (RFIC) Symposium Digest*, Pages 53 to 56, Seattle Wash., USA, June 2002) to 12 mm (*European Conference on Wireless Technology*, Pages 181 to 184, 2001). These devices operate by parallelling multiple transistor drain resistances to reduce their overall effect on circuit behaviour. However, the beneficial effect of this approach is achieved with the expense of additional device manifold losses.

3. Amplification of Modulated Signals (a) Phase Shift Keying (PSK)

Phase-shift keying (PSK) is a method of transmitting and receiving digital signals in which the phase of a transmitted signal is varied to convey information. There are several schemes that can be used to accomplish PSK including biphase modulation (BPSK) and Quadrature Phase Shift Keying (QPSK). QPSK is widely used in code division multiple access (CDMA) cellular services, wireless local loop and digital video broadcasting-satellite (DVB-S).

Since the informational content of a QPSK signal is contained within its phase, the necessity for linear amplification is not as extreme as with QAM signals. However, since large envelope variations can occur during phase transitions, linear amplification of QPSK signals is nonetheless generally required. Consequently, a class E power amplifier would not normally be considered for the amplification of QPSK signals.

(b) Quadrature Amplitude Modulation (QAM)

QAM is a modulation scheme that combines amplitude modulation and phase shift keying to transmit several data bits per symbol and is primarily used in microwave digital radio, digital video broadcasting-cable (DVB-C) and modems. For example, eight state quadrature amplitude modulation (i.e. 8QAM) signals typically have four phase states and two amplitude states (i.e. two concentric rings on a constellation plot, each ring corresponding with a particular amplitude state and comprising four points corresponding with the phase states).

The informational content of a QAM signal is contained in the amplitude of the signal. Consequently, if it is necessary to amplify a QAM signal, the amplification should be performed with a linear amplifier in order to preserve the informational content of the signal. Similarly, it should not be theoretically possible to preserve the informational content of a QAM signal if it is subjected to non-linear amplification. For example, if a non-linear amplifier is used to amplify an 8QAM signal, the resulting signal should in theory possess four states because the outer concentric ring from the constellation plot of the original signal would have collapsed onto the inner concentric ring. In view of the above, a class E power amplifier would not normally be considered for the amplification of QAM signals.

Linear power amplifiers are typically less efficient than switching power amplifiers since current flows through the active device at the same time as there is a voltage across the device for at least a portion of a RF cycle. Since both QAM and QPSK signals generally require linear amplification, the transceiver circuits used for transmitting and receiving such signals are characterised by high power consumption.

SUMMARY OF THE INVENTION

According to a first aspect of the invention there is provided a class E power amplifier circuit comprising an active device, a DC blocking element and an oscillating element, wherein the oscillating element is driven by a voltage signal.

Desirably, the oscillating element is a LC resonant circuit connected in parallel with the active device and in series with the DC blocking element.

Preferably, the class E power amplifier circuit comprises a load resistor connected in parallel to the oscillating element.

Desirably, the oscillating element forces a sinusoidal voltage over the load resistor and the active device.

Preferably, the class E power amplifier circuit comprises a first inductor connected in series with the active device.

Preferably, the first inductor is connected in series with the DC blocking element.

Preferably, the DC blocking element comprises a RF choke and a first capacitor.

Preferably, the active device is switched from an 'ON' state in which the active device operates as a closed switch to an 'OFF' state in which the active device operates as an open switch wherein the switching operation is controlled by a RF signal.

Preferably, the switching activity of the active device stimulates a sinusoidal voltage in the oscillating element.

Desirably, when the active device is in its 'ON' state, a current flows through the switch and the sinusoidal voltage developed in the oscillating element is dropped across the load resistor.

Similarly, when the active device is in its 'OFF' state, a current flows through the load resistor and the voltage developed by the oscillating element is dropped exclusively across the active device.

According to a second aspect of the invention there is provided a signal transmission circuit comprising a class E power amplifier, which in turn comprises an active device, a DC blocking element and an oscillating element, wherein the oscillating element is driven by a voltage signal.

According to a third aspect of the invention there is provided a phase modulated signal transmission circuit comprising a class E power amplifier, which in turn comprises an active device, a DC blocking element and an oscillating element, wherein the oscillating element is driven by a voltage signal.

According to a fourth aspect of the invention there is provided a phase shift keying signal transmission circuit comprising a phase shift keying modulator and a class E power amplifier comprising an active device, a DC blocking element and an oscillating element, wherein the oscillating element is driven by a voltage signal.

Preferably, the phase shift keying signal transmission circuit incorporates an analogue signal source connectable to a class E power amplifier bias voltage control means so that the analogue signal source modulates the output from the phase shift keying modulator.

According to a fifth aspect of the invention there is provided an amplitude modulated signal transmission circuit comprising an amplitude modulator and a class E power amplifier comprising an active device, a DC blocking element and an oscillating element, wherein the oscillating element is driven by a voltage signal.

Preferably the amplitude modulated signal transmission circuit comprises an input signal splitting means and a voltage control means wherein the input signal splitting means splits a digital input signal into a series of multiple bit words, wherein at least one bit of a resulting word is transmitted to the voltage control means to control the bias voltage of the class E power amplifier and wherein the remaining bits of the resulting word are transmitted to the amplitude modulator for amplification by the class E power amplifier.

Desirably, the amplitude modulated signal transmission circuit is a quadrature amplitude modulated signal transmission circuit.

ADVANTAGES OF THE INVENTION

To distinguish the present invention from traditional class E power amplifier circuits, the class E power amplifier circuit in accordance with the first aspect of the invention will henceforth be known as the improved class E power amplifier circuit.

Being voltage-based, the improved class E power amplifier circuit is much less sensitive to parasitic channel resistances than conventional current-based class E power amplifier circuits. Thus, in contrast with conventional class E power amplifier circuits that employ large pHEMTs as active devices (in an attempt to reduce channel resistance) the improved class E power amplifier circuit can in addition use short or moderate gate-width pHEMT devices (i.e. those compliant with commercial microwave monolithic integrated circuit (MMIC) foundry processes). As a consequence, the way is opened for commercial class E amplifier design at microwave and millimeter-wave frequencies.

Furthermore, since the improved class E power amplifier circuit does not require the matching of the switching timing of the active device to the discharge time of a shunt capacitor, the design constraints on the improved class E power amplifier circuit are not as demanding as those of the traditional class E power amplifier circuit.

In conflict with accepted theory which has taught that it is not possible to use non-linear amplifiers to successfully amplify QAM or PSK signals, two circuit topologies making use of the improved class E power amplifier circuit have been designed to produce 8QAM and Global System for Mobile Communications (GSM) signals respectively. As an aside it will be recalled that GSM signals typically employ Gaussian Minimum Shift Keying (GMSK) modulation, which is a form of continuous-phase frequency shift keying (FSK) in which the phase is changed between symbols to provide a constant envelope.

Both circuit topologies are comparatively simple and contain a small number of components. Consequently, these circuits can be readily produced as integrated circuits, making them ideal for mass production or system-on-a-chip (SoC) applications. Since the circuit topologies are based on class E amplifiers, they promise to be highly efficient and could thus be powered by a battery or an array of solar cells.

The PSK transmitter circuit topology also provides the facility whereby a pilot signal at a much lower frequency than the carrier frequency can be added to the PSK signal by means of the DC bias voltage control. This would enable additional modulation to be added to the PSK signal in order to transmit additional information, for example authentication codes, base-station handover signals at mobile wireless cell boundaries, sensor readings, synchronisation purposes.

DESCRIPTION AND DRAWINGS

Three embodiments of the invention will now be described by way of example only with reference to the accompanying figures in which:

FIG. 2 is an equivalent circuit diagram for an improved class E power amplifier in accordance with the first embodiment of the invention;

FIG. 3 contains graphs of the simulated voltage and current waveforms of a traditional class E power amplifier with (A) an ideal switch (B) and a lossy switch and the (C) simulated voltage and current waveforms of the improved class E power amplifier in accordance with FIG. 2, with a lossy switch;

FIG. 4 contains graphs of the voltage and current waveforms of the improved class E power amplifier in accordance with FIG. 2, simulated for an ED02AH MMIC;

As discussed above, the detrimental effect of parasitic resistances on circuit performance in conventional class E power amplifiers is caused by the current flowing through the switching active device. The improved Class E power amplifier overcomes this problem by employing a voltage signal to drive the amplifier circuit.

The following description will discuss the following topics:

(a) the structure of the improved class E power amplifier circuit;

(b) the operation of the improved class E power amplifier circuit;

(c) a simulation of the improved class E power amplifier circuit using ideal and non-ideal circuit components;

(d) the design and performance of a hybrid monolithic integrated circuit (MIC) prototype of the improved class E power amplifier circuit;

(e) properties of the improved class E power amplifier circuit (namely its phase conformance and ability to control the amplitude of the output signal by varying the circuit's DC bias voltage);

(f) the design and performance of a transmitter circuit for a phase shift keying (PSK) signal, wherein the circuit incorporates the improved class E power amplifier circuit; and (g) the design of a transmitter circuit for an N-state quadrature amplitude modulated (QAM) signal, wherein the circuit incorporates the improved class E power amplifier circuit.

1. Structure of Improved Class E Power Amplifier Circuit

Figure 1:
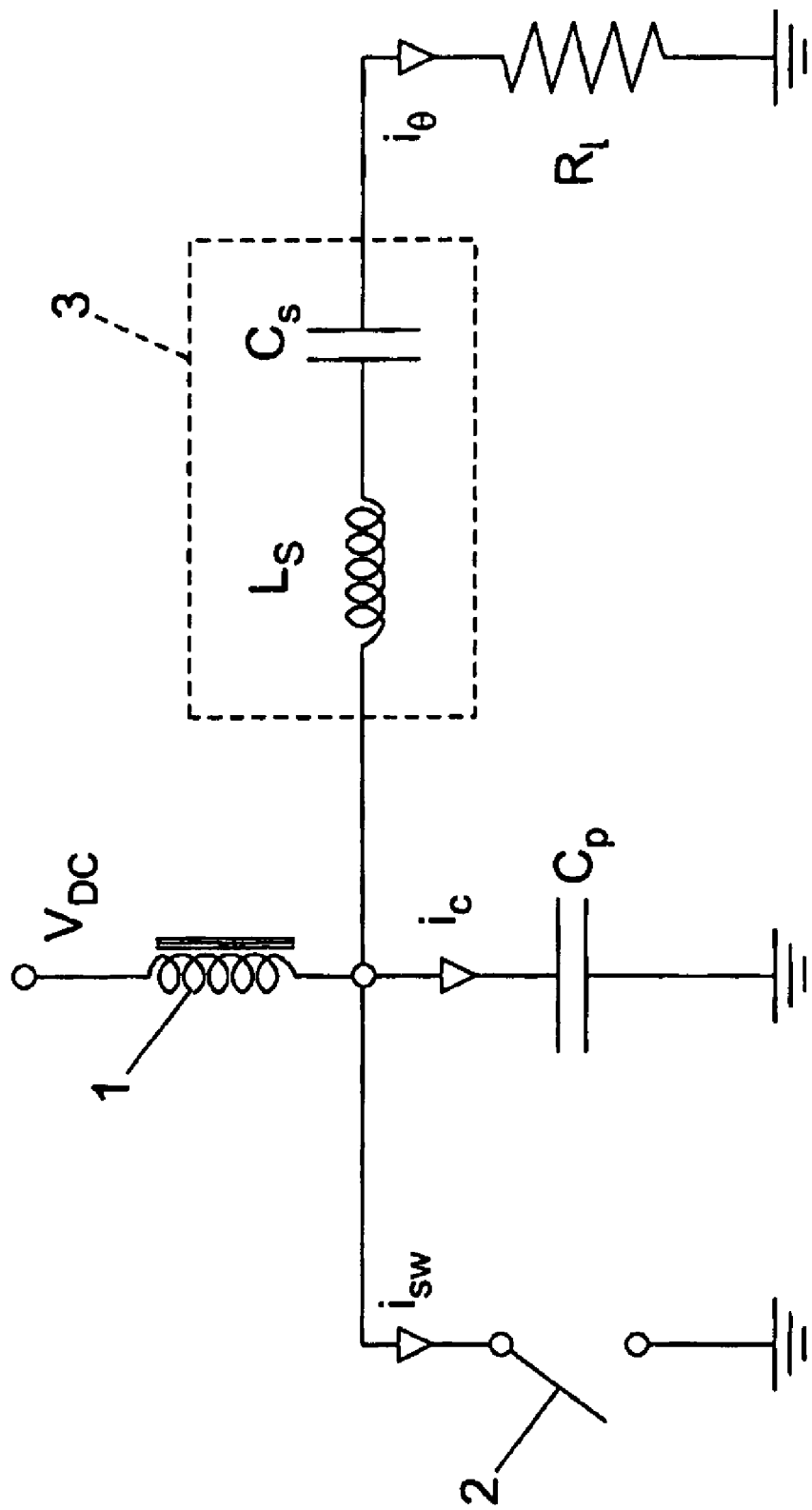
Figure 2:
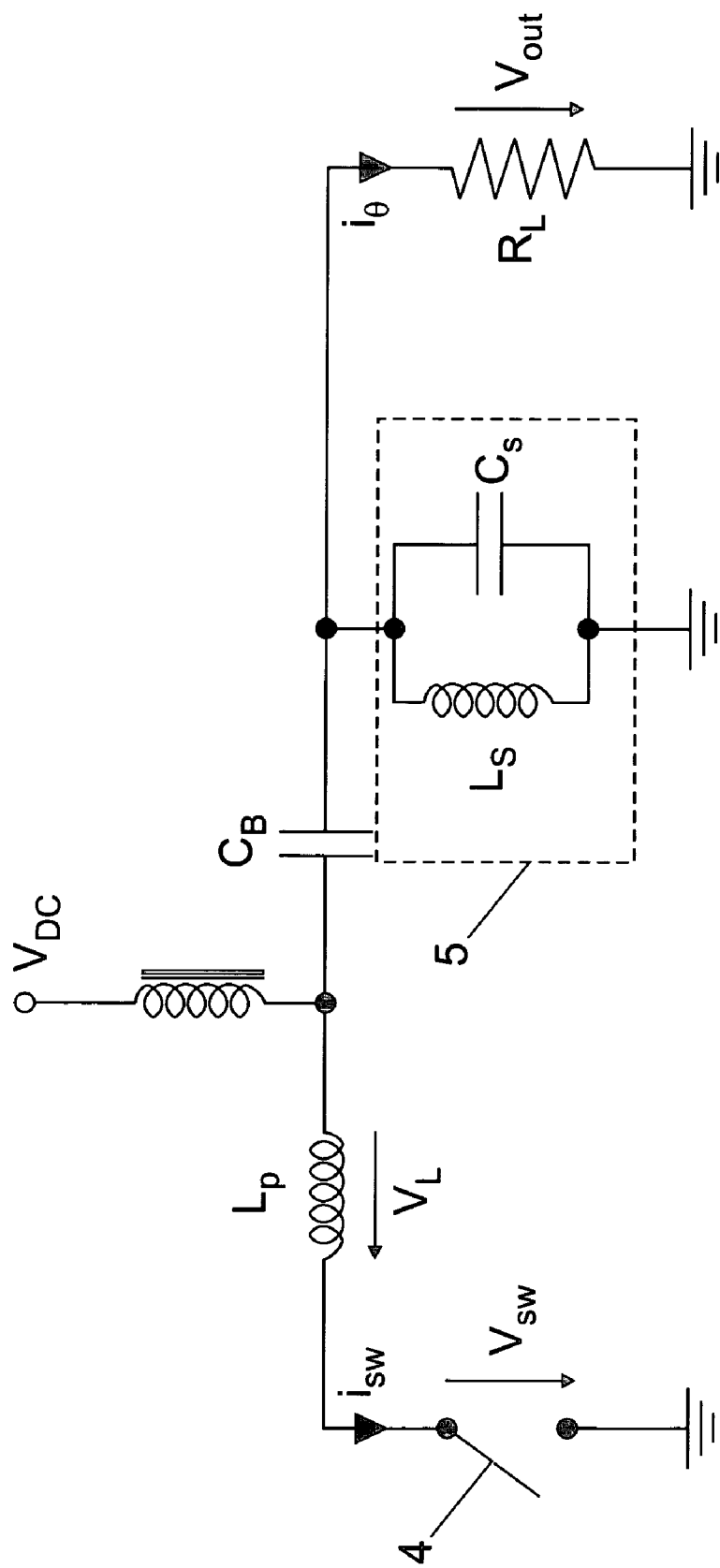

Referring to FIG. 2, in a similar fashion to the traditional class E power amplifier circuit, the improved class E power amplifier circuit comprises an active device which is represented as a switch 4. Comparing FIG. 1 with FIG. 2, it can be seen that the shunt capacitor $C_p$ in FIG. 1 has been replaced by a series inductor $L_p$. The series inductor $L_p$ acts as an energy store (while the switch 4 is closed) in an analogous fashion to the shunt capacitor $C_p$ in the traditional class E power amplifier circuit (FIG. 1).

In addition, the series resonant circuit 3 (in FIG. 1) has been replaced with a parallel resonant circuit 5 (comprising an inductor $L_s$ and a capacitor $C_s$). Whereas the series resonant circuit 3 (FIG. 1) of the conventional class E power amplifier forces a sinusoidal current through the load resistor $R_L$, the parallel resonant circuit 5 of the improved class E amplifier circuit forces a sinusoidal voltage over the load resistance $R_L$ and the switch 4.

Finally, the improved class E power amplifier circuit also includes a DC blocking capacitor $C_B$ connected in series with series inductor $L_p$. The DC blocking capacitor $C_B$ prevents a DC bias voltage from being shorted by $L_p$ and entering the load resistor $R_L$. To ensure the correct operation of the circuit, the capacitance of the blocking capacitor $C_B$ must be sufficiently large to enable RF signals to propagate through it by electromagnetic effects. Under these conditions the blocking capacitor $C_B$ acts (in a first approximation) as a short circuit for RF signals and therefore has no impact on the circuit's RF performance.

2. Modes of Operation of Voltage-Driven Class E Power Amplifier Circuit

As mentioned above, the active device in the improved class E power amplifier circuit operates (and is represented in FIG. 2) as a switch, having two discrete states, namely ON (switch is closed) and OFF (switch is open).

(i) OFF State Operation

If the switch 4 is open (i.e. $i_{sw}=0$) the sinusoidal voltage developed by the parallel resonant circuit 5 builds up exclusively over the switch 4 (to form $v_{sw}$ not shown) since $$v_L = \frac{d i_{sw}(t)}{dt}.$$

In addition, the output current $i_\theta$ flows entirely through the load resistor $R_L$.

(ii) ON State Operation

If the switch is closed, the output current $i_\theta$ flows entirely through the switch 4, thereby forming $i_{sw}$. In addition, since $v_{sw}=0$ the sinusoidal voltage developed by the parallel resonant circuit 5 builds up over $L_p$.

From the above, it can be seen that the improved class E power amplifier circuit is designed to ensure that at no point is there a current flowing through the active device at the same time that a voltage is dropped across the device. Consequently, the improved class E power amplifier should theoretically retain the power efficiency characteristics of the traditional class E power amplifier.

3. Simulation of Voltage-Driven Class E Power Amplifier Circuit

Before developing a monolithic integrated circuit (MIC) implementation of the improved class E power amplifier circuit, the performance characteristics of the circuit were analysed by simulating the circuit with Agilent's Advanced Design System (ADS) transient analysis software. The circuit was first simulated with the assumption that the active device behaved like an ideal switch with an adjustable series resistance. For a more realistic assessment of the improved class E power amplifier circuit's performance, the circuit was then simulated with the assumption that the active device behaved as a lossy switch.

(a) Evaluation of Voltage-Driven Class E Power Amplifier Using Ideal Components

Figure 3:
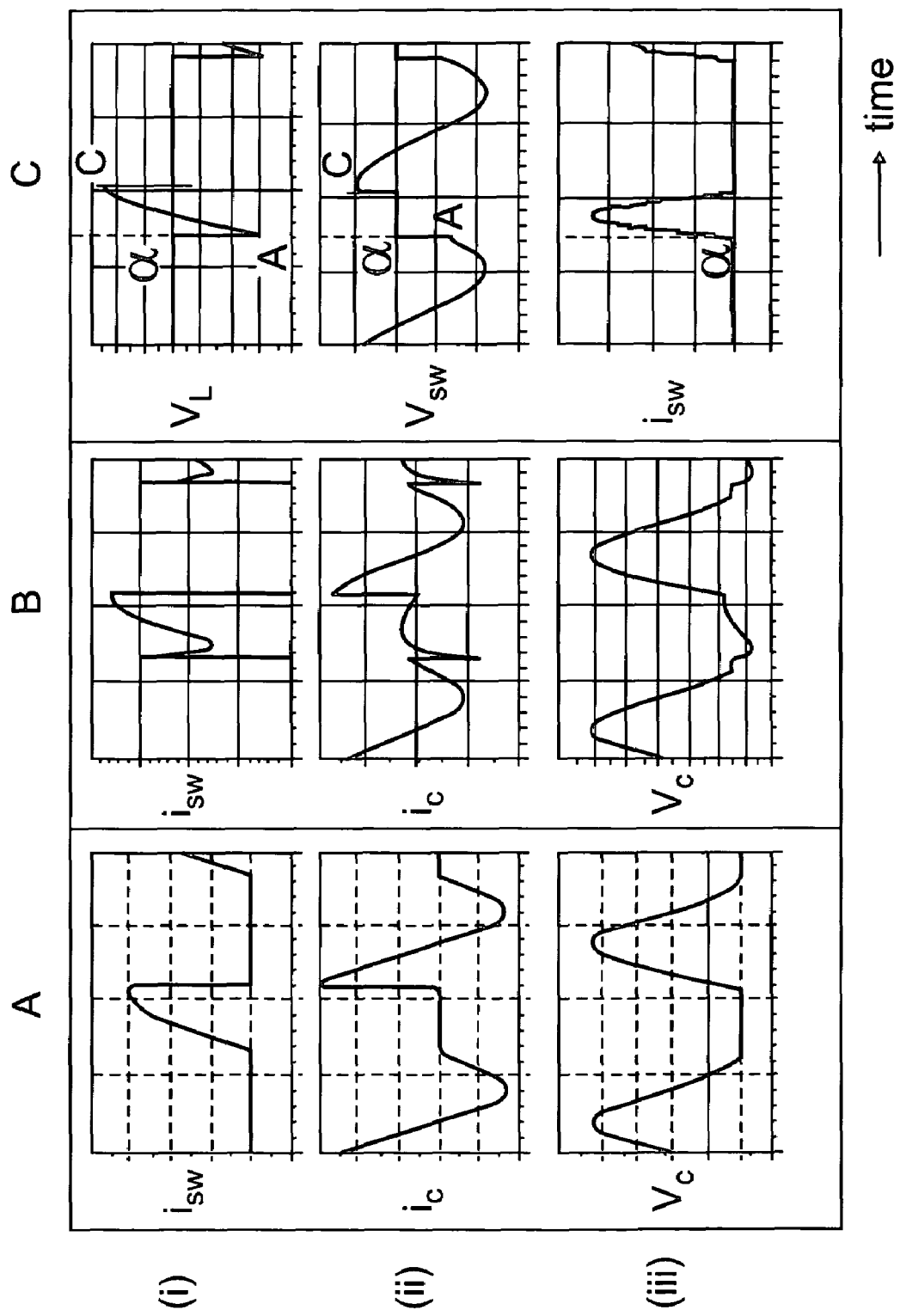

FIG. 3 compares the waveforms of the improved class E power amplifier circuit with those of a traditional class E power amplifier circuit. The graphs in Column A (i.e. left-most column) show the voltage and current waveforms for a traditional current-driven class E power amplifier with an ideal switch (i.e. a switch with an internal resistance of $0.1\Omega$ in the closed state). In particular, the graphs in Column A show from top to bottom (i) the switch current $i_{sw}$; (ii) the shunt capacitor current $i_C$; and (iii) the voltage across the shunt capacitor $V_C$ for the ideally-behaving traditional class E power amplifier circuit.

The graphs in Column B (i.e. centre column) show (i) the switch current $i_{sw}$; (ii) the shunt capacitor current $i_c$; and (iii) the voltage across the shunt capacitor for the traditional class E power amplifier circuit. However, in this case the active device is represented as a switch with a resistance of $5\Omega$ in the closed state. This resistance represents the typical parasitic resistance experienced by a medium size pHEMT device. In fact in small pHEMTs (e.g. 100 µm total gate width) the drain-to-source resistance can be as high as $20\Omega$ (R. E. Anholt, *Electrical and thermal characterization of MESFETs, HEMTs, and HBTs*. Norwood, Mass., USA: Artech House Inc., 1995).

Comparing the graphs in Column A with those in Column B it can be seen that all the waveforms of the non-ideal traditional class E power amplifier are significantly distorted compared with those of the ideal amplifier. This distortion is caused by the longer time constant of the shunt capacitor ($C_p$)/switch resistance combination. The longer time constant of the shunt capacitor $C_p$ prevents it from fully discharging (i.e. $V_C$ does not return to zero at the end of a RF cycle) thereby causing a spike to appear on the switching current $i_{sw}$ upon switching. This in turn upsets the oscillation of the series resonant circuit 3 (in FIG. 1) and has the effect of introducing distortion into the output signal $i_\theta$. Overall, this has the effect of reducing the efficiency of the power amplifier circuit.

The graphs in Column C (i.e. right-most column) show from top to bottom (i) the inductor voltage $v_L$; (ii) the switch voltage $v_{sw}$; and (iii) the inductor current $i_{sw}$ of the improved class E power amplifier circuit. These graphs were obtained from the simulations of the improved class E power amplifier circuit under the assumption that the circuit's active device was a switch with a $5\Omega$ internal resistance. Comparing the graphs in Column C with those in Columns A and B it can be seen that whilst the waveforms of the improved class E power amplifier have a different timing than those of the traditional class E power amplifiers, nonetheless $v_{sw}$ and $i_{sw}$ are zero at the switching point α.

Bearing in mind that the graphs in Column C do not have the same scales, it can be seen that the $v_L$ waveform (graph (i) in Column C) fits exactly into the removed section of the $v_{sw}$ sinusoidal waveform (marked as A-C in figure (ii) in Column C). Since the output voltage $v_{out}$ is the sum of $v_L$ and $v_{sw}$, the fitting of the $v_L$ waveform into the $v_{sw}$ waveform results in an undistorted sinusoidal output voltage. This ensures that the output signal does not contain harmonics that could cause problems in a transmitter chain.

(b) Evaluation of Voltage-Driven Class E Power Amplifier Using Realistic (Non-Ideal) Components To obtain a more realistic analysis of the performance of the improved class E power amplifier circuit, the switch representing the active device was replaced with a model of a 6×50 μm ED02AH GaAs pHEMT supplied by OMMIC (OMMIC, *ED02AH Library Agilent-ADS Simulator*, July 2002. Release V2.6.) and all the circuit connections and lumped components were replaced with their respective MMIC counterparts. The resulting simulated waveforms can be seen in FIG. 4.

Figure 4:
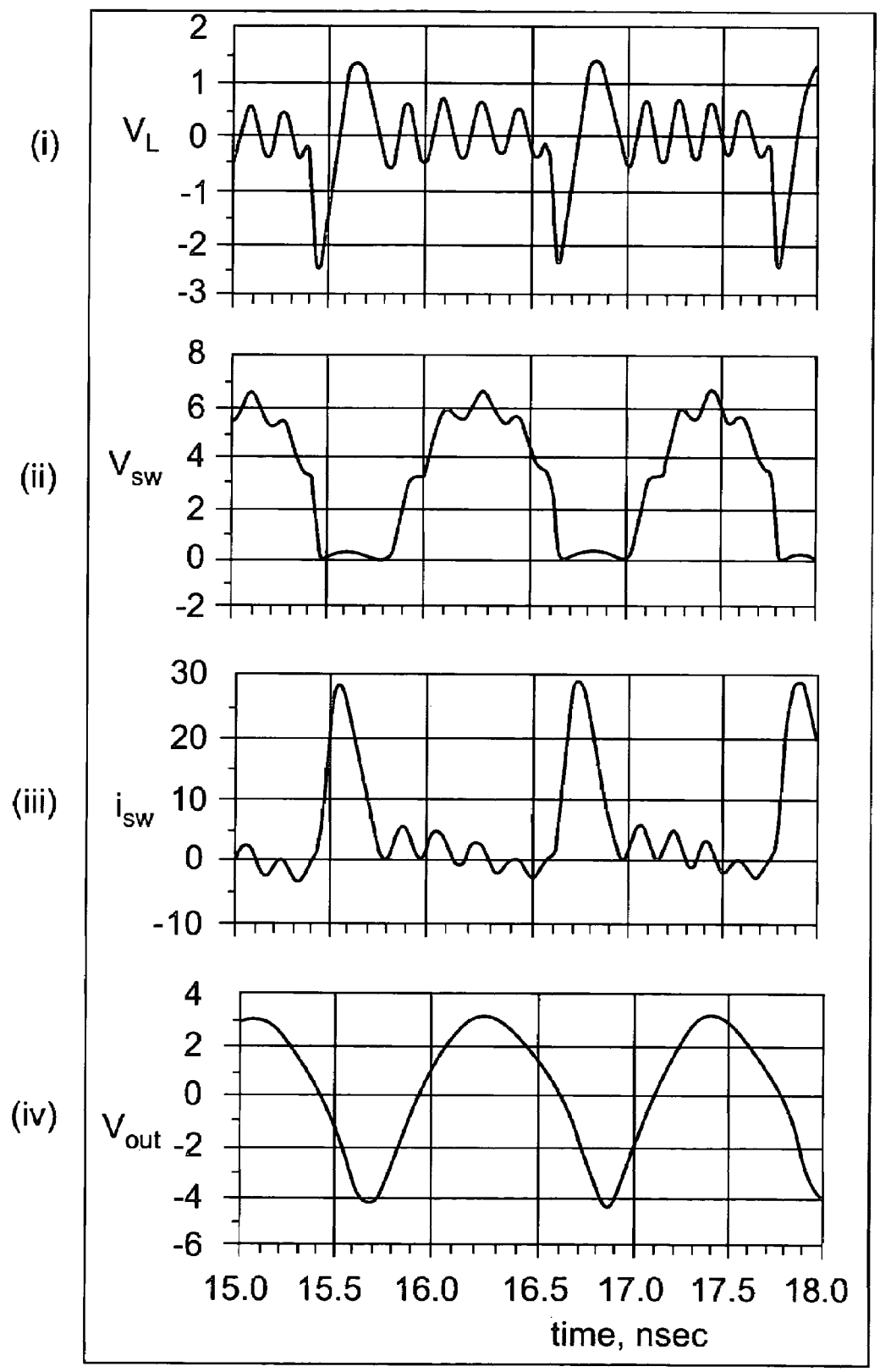

In a similar fashion to Column C in FIG. 3, FIG. 4 shows from top to bottom: (i) the inductor voltage $v_L$; (ii) the voltage over the switch $v_{sw}$; (iii) the current through the switch $i_{sw}$; and (iv) the output voltage across the load resistance $R_L$; ($v_{out2}$). It can be seen that these waveforms generally follow the trend in FIG. 3, Column A, but are overlaid with ripple. However, the ripple is a transient simulation artefact (related to the time domain to frequency domain conversion necessary for the OMMIC non-linear model to operate).

4. Hybrid MIC Implementation of Improved Class E Power Amplifier Circuit (a) Circuit Description A hybrid MIC implementation of the improved class-E power amplifier circuit was designed on a Taconics TLY-5-0100-CH soft-board mounted on a brass carrier using conductive epoxy to provide mechanical stability. Standard surface-mount components were used for the passive network components of the circuit and a discrete OMMIC ED02AH 6×50 μm pHEMT was used for the active device.

The active device was mounted with conductive epoxy onto a brass pedestal to bring its surface level with the TLY-5 substrate, and electrical connections were established using 25 μm gold wire-bonding. SMA connectors were soldered directly onto the TLY-5 microstrip lines, and gate bias was supplied using a bias tee through the $RF_{in}$ port.

For simplicity, the initial hybrid MIC implementation of the improved class E amplifier circuit was built without gate or drain matching circuits since it was expected that a mismatch would have little impact on signal quality. Furthermore, the signal losses resulting from reflected signal power were also accepted.

(b) Measurement Results

The input signal to the hybrid MIC improved class E power amplifier circuit was generated by an Agilent HP 8657 B signal generator producing 10 dBm at 870 MHz. The active device gate bias was added to the circuit using a bias tee, and fed to the $RF_{in}$ port of the class E amplifier and the drain bias was directly supplied to the $v_{cc}$ port of the amplifier.

Bearing in mind the requirements of the mobile telecommunications industry, the improved class E power amplifier's active device was biased with a 2V drain voltage to be compatible with mobile power supplies. Furthermore, the gate voltage was chosen to be −0.3V to ensure a correct conduction angle. Finally, the output signal from the hybrid MIC improved class E power amplifier circuit was fed to an Agilent HP E 4407 B spectrum analyser.

Table 1 below lists the relevant component values for the hybrid MIC implementation of the improved class E power amplifier circuit.

TABLE 1

Component Parameters for the hybrid MIC improved class E power amplifier.

| Component | Value |
| --- | --- |
| Switch | ED02AH 6 × 50 μm pHEMT |
| $L_p$ | 6.5 nH |
| RF Choke | 37 nH |
| $L_s$ | 37 nH |
| $C_s$ | 1 pF |
| $R_L$ | 1 kΩ |

Figure 5:
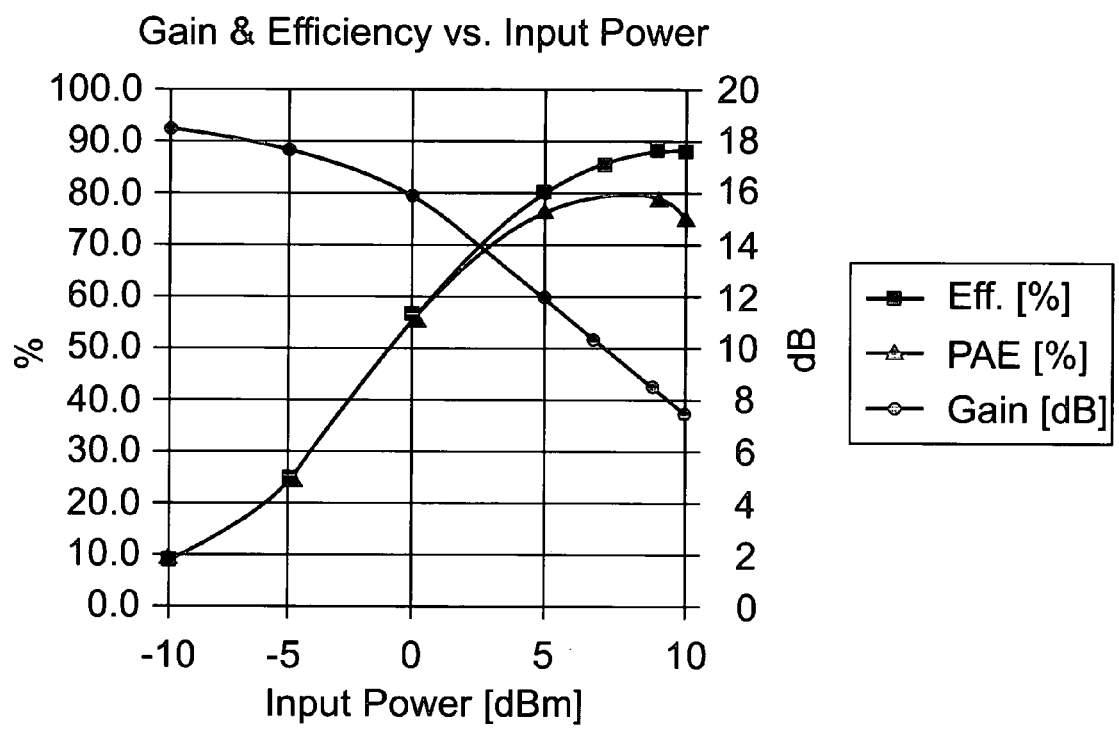
FIG. 5 is a graph of gain, efficiency and power added efficiency (PAE) against the input power to the hybrid MIC implementation of the improved class E amplifier in accordance with FIG. 2.

According to FIG. 5, the improved class E power amplifier exhibited a maximum gain of 18 dB, a maximum efficiency of 88%, and a maximum power added efficiency (PAE) of 79%. Accounting for the power lost due to input mismatch, it is estimated that the PAE value could be as high as 87% if the circuit were properly matched. At its nominal operating frequency of 870 MHz, the power amplifier exhibited 8.3 dB gain at a maximum output power of 17.3 dBm (53.7 mW), 88% efficiency and 79% maximum power added efficiency. The output-return loss was 7.5 dB, and the input-return loss just 0.05 dB. These results are not particularly surprising, since the initial hybrid-MIC implementation of the improved class E power amplifier circuit was not made to match 50Ω.

Figure 6:
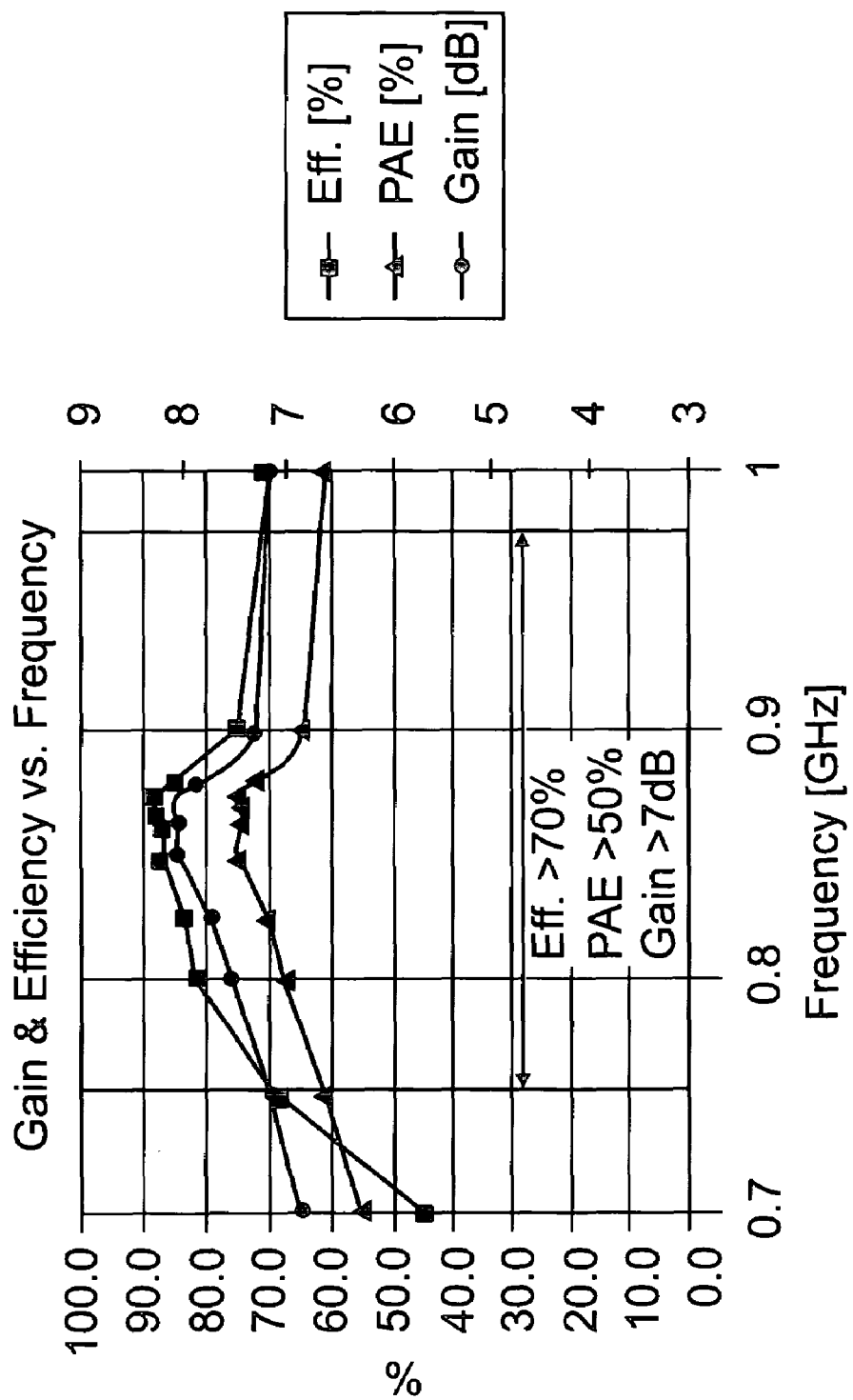
FIG. 6 is a graph of gain, efficiency and PAE against the frequency of the input signal to the hybrid MIC implementation of the improved class E power amplifier in accordance with FIG. 2.

FIG. 6 is a graph of gain, efficiency and PAE against the frequency of the input signal to the hybrid MIC implementation of the improved class E power amplifier circuit. According to FIG. 6 the hybrid-MIC implementation of the improved class E power amplifier circuit easily maintains an efficiency of more than 70%, a power added efficiency of more than 50%, and a gain of more than 7 dB over more than 20% bandwidth.

Table 2 provides a comparison between the performance of the improved class E power amplifier circuit with the performance of recently published traditional class E power amplifier designs.

TABLE 2

Comparison of class E power amplifier circuit designs
Class E Amplifier Performance

| | Improved Amplifier | Nagle[1] | Tayrani[2] | Greben[3] | Koller[4] |
| --- | --- | --- | --- | --- | --- |
| Device | pHEMT | pHEMT | pHEMT | HBT | HBT |
| $L_g$ | 0.3 mm | 12 mm | 1 mm | n/a | n/a |
| $P_{out}$ | 17 dBm | 32 dBm | 23 dBm | 33 dBm | 35 dBm |
| Gain | 18 dB | 9.5 dB | 15 dB | 33 dB | — |
| η | 88% | 53% | — | 57% | 71% |
| PAE | 79% | 49% | 90% | 47% | 63% |

TABLE 2-continued

Comparison of class E power amplifier
circuit designs
Class E Amplifier Performance

|  | Improved Amplifier | Nagle[1] | Tayrani[2] | Greben[3] | Koller[4] |
|---|---|---|---|---|---|
| Freq. | 870 MHz | 900 MHz | 3.25 GHz | 1.8 GHz | 900 MHz |
| $V_{cc}$ | 2 V | 3.3 V | 12 V | 3.5 V | 3.6 V |

[1] P. Nagle, P. Burton, E. Heaney, and F. McGrath, European Conference on Wireless Technology, p. 181-184, 2001.
[2] R. Tayrani, IEEE Radio Frequency Integrated Circuits (RFIC) Symposium Digest, (Seattle, WA, USA), p. 53-56, IEEE Microwave Theory and Techniques Soc., IEEE Electron Devices Soc., IEEE Solid States Circuits Soc., June 2002.
[3] A. Grebennikov, H. Jaeger, R. Weigel, 6th European Conference on Wireless Technology, Munich, 2003, p. 313-316.
[4] R. Koller, A. Stelzer, K.-H. Abt, A. Springer, R. Weigel, 33rd European Microwave Conference, Munich, 2003, p. 257-260.

From Table 2 it can be seen that the improved class E power amplifier compares well with the prior art current-driven pHEMT devices. For example, whilst Nagle[1]'s class E power amplifier exhibited a gain of 9.5 dB, an output power of 31.5 dBm, and a PAE of 53% at 900 MHz, Nagle's MIC was considerably larger (i.e. 12 mm total gate length) than the hybrid MIC improved class E power amplifier (i.e. 300 µm total gate length). Similarly, whilst Tayrani[2]'s class E amplifier MMIC exhibited 13 dB gain and a peak PAE of 90% at 3.25 GHz, the amplifier was comparatively large (i.e. 1000 µm total gate length). In addition, Tayrani's amplifier required a bias voltage of 12 V, which is not feasible for mobile telecommunications devices.

5. Class E Power Amplifier Digital Modulation Properties (a) Phase Conformity

It will be recalled from the earlier discussions of conventional class E power amplifiers that the RF input signal to the active device only controls the timing of the closing and opening operations of the device.

Thus the amplitude of the output signal from a class E power amplifier is theoretically completely independent of the amplitude of the input signal. Consequently, amplitude control of the amplifier's output signal must be incorporated at, or behind, the amplifier stage. This renders the amplifier unsuitable for amplitude modulation applications when a constant bias is applied to the device.

In addition, referring back to FIG. 1, it will be recalled that for the conventional class E power amplifier to work the resonant circuit 3 must be capable of sustaining oscillation while the switch 2 is open. Consequently, the resonant circuit 3 must have a sufficiently large Q value to produce a reasonable fly-wheel effect. This feature raises the question of whether the fly-wheel effect of the output resonant circuit 3 would delay the propagation of phase changes (at the input port) through the circuit to a sufficient extent to limit the circuit's applicability in phase modulation transmission systems. If such were the case, it would be particularly problematic for transmission systems employing digital modulation because these systems are characterised by fast phase transitions.

To investigate this question, an Anritsu MG 3660 A modulation generator was used to create a 270 kbps Gaussian Minimum Shift Keying (GMSK) signal with a carrier frequency of 870 MHz. The resulting 12 bit GMSK signal was then fed through the hybrid MIC improved class E amplifier circuit and the amplifier's output was monitored on an Anritsu MT 8801 B modulation analyser.

Figure 7:
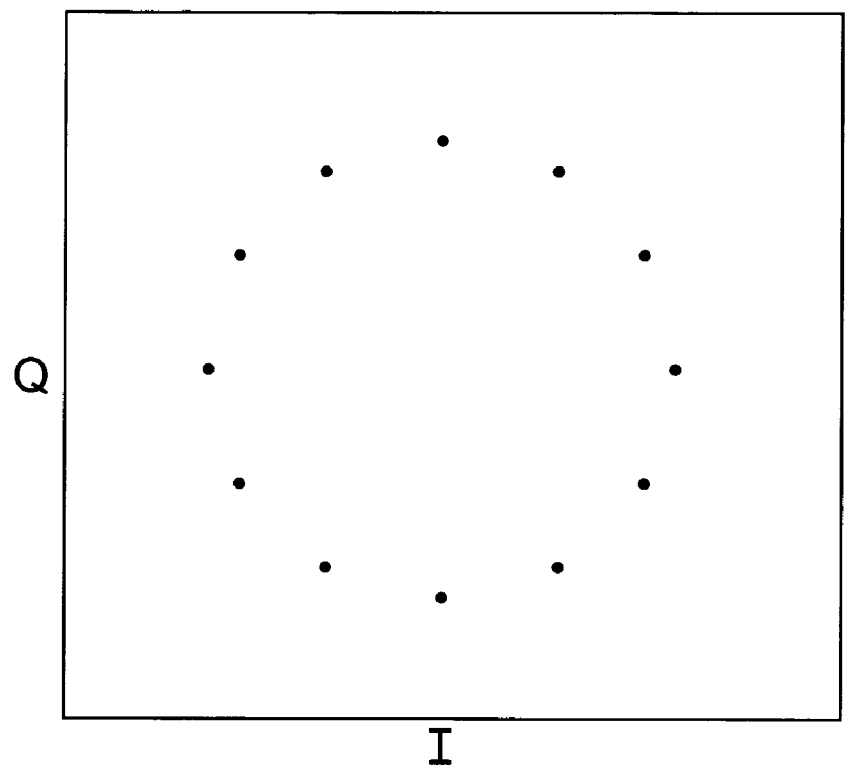
FIG. 7 is a constellation plot of a 12 bit GMSK signal amplified by the improved class E power amplifier in accordance with FIG. 2.

FIG. 7 is the constellation plot of the 12 bit GMSK signal after being amplified by the improved class E amplifier. The RMS phase error (<0.5°) and the peak phase error (<1°) measured in this study were below the tolerances (i.e. measurement resolution) of the MT 8801 B for these measurements (i.e. RMS tolerance ±2°, peak phase tolerance ±4°). From this it can be concluded that the improved class E power amplifier preserves the phase relationships of an input signal and could potentially be used in a phase modulation transmission circuit.

(b) Output Power as a Function of the DC Bias Voltage

To investigate the suitability of the improved class E amplifier for the final power amplifier stages of a mobile phone, its ability to maintain high efficiency over a wide output power range was examined.

Figure 8:
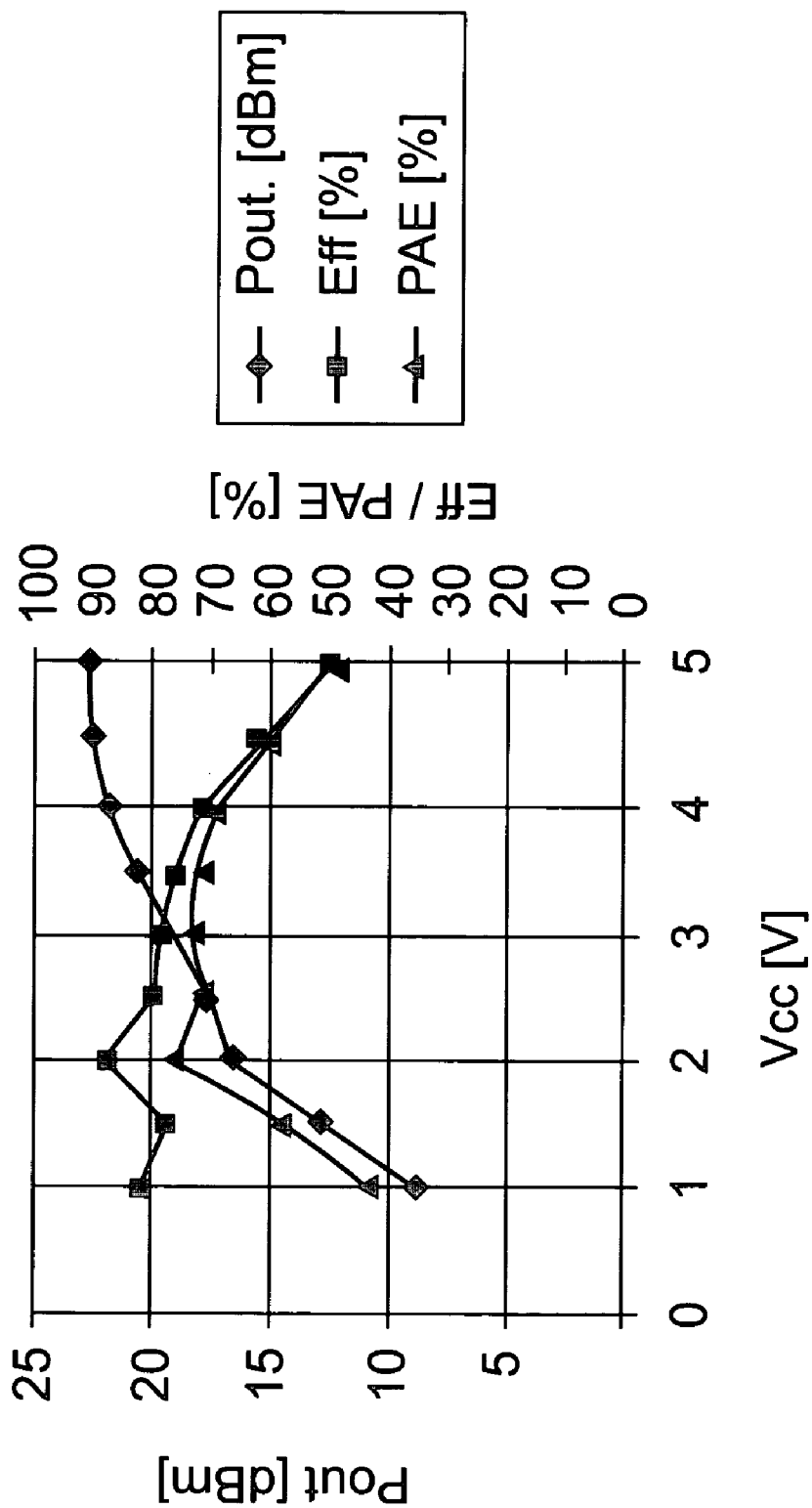
FIG. 8 is a graph of output power, efficiency and PAE against the bias voltage to the hybrid MIC implementation of the improved class E power amplifier in accordance with FIG. 2.

FIG. 8 is a graph of output power, efficiency and PAE against the bias voltage to the hybrid MIC improved class E power amplifier. From FIG. 8 it can be seen that by increasing the bias voltage from 1V to 5V, the output power of the hybrid MIC improved class E power amplifier circuit can be varied over a range of 13.8 dB.

Whilst the efficiency and PAE of the hybrid MIC improved class E power amplifier circuit vary over the bias voltage range, nonetheless the efficiency and PAE of the amplifier remain in excess of 49% and 43% respectively. This performance compares very favourably with conventional linear power amplifiers (e.g. class A or B) whose efficiency drops exponentially when operated in power back-off mode (P. M. Asbeck, L. E. Larson, and I. G. Galton, IEEE Transactions on Microwave Theory and Techniques, 2001, 49(11), p. 2163-2169).

In contrast with the traditional teaching in regard to the behaviour of switching amplifiers, the results from this study indicate that it is possible to control the amplitude of the output signal from the improved class E power amplifier by varying its DC bias voltage.

6. Novel Transmitter Topologies

The results of the previous studies of the properties of the improved class E power amplifier circuit suggested the possibility of using the amplifier to create circuits capable of incorporating PSK and N-state QAM schemes. The following discussion will describe each of transmitter topologies in turn and will be supported by proof-of-concept measurements.

It will be recalled that QAM combines amplitude modulation with phase shift keying. Accordingly, since the preservation of a phase modulated signal is a prerequisite for QAM transmission, the PSK transmitter will be the first circuit considered.

(a) High-Speed PSK Transmitter with Amplitude Modulated (AM) Pilot Signal

Figure 9:
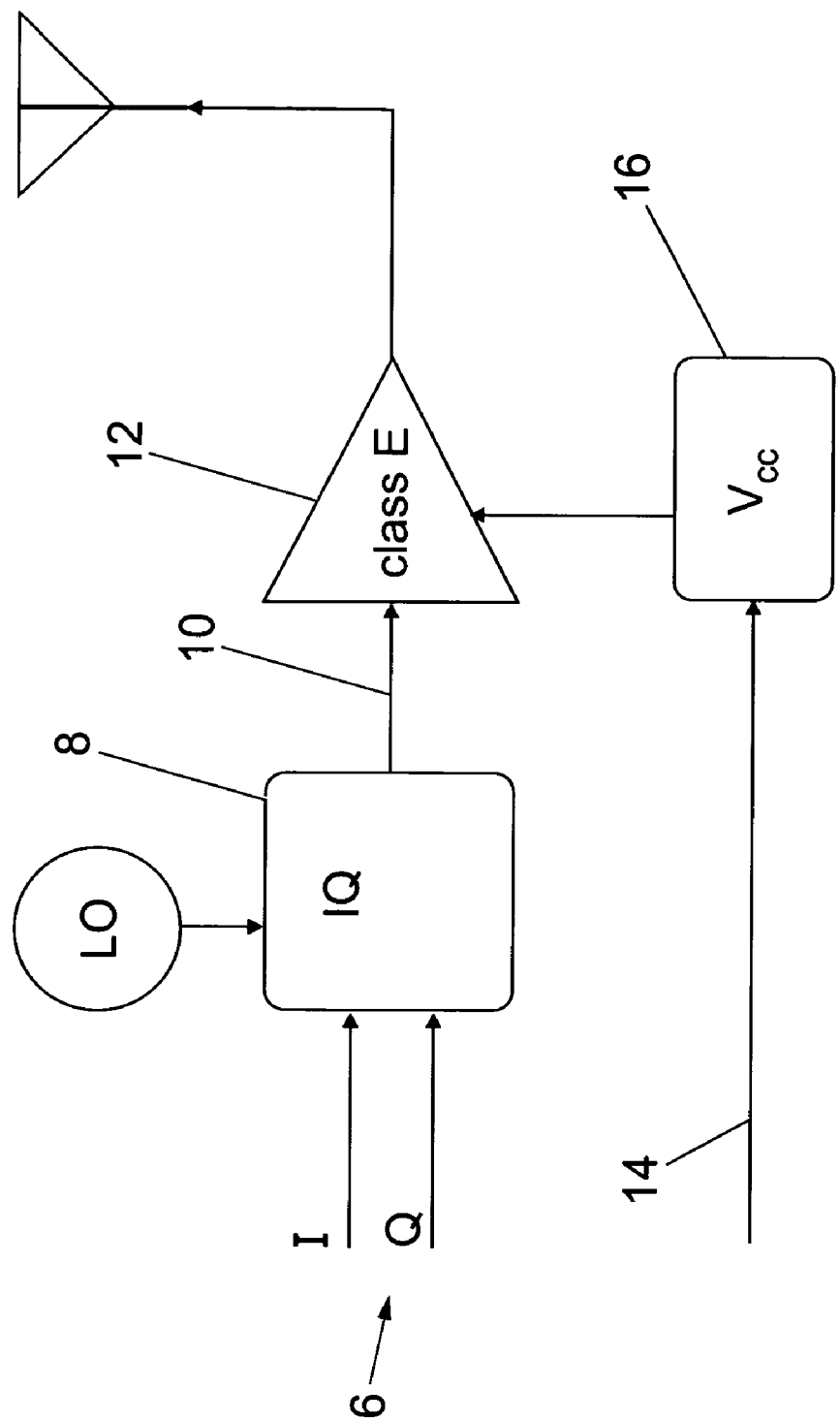
FIG. 9 is a circuit diagram for a phase shift keying (PSK) transmitter in accordance with the third embodiment of the invention.

FIG. 9 is a circuit diagram for the novel transmitter topology for a PSK modulated signal with an added amplitude modulated pilot signal, wherein the transmitter circuit is based on the improved Class E power amplifier.

A high-speed data stream 6 is fed to a conventional IQ modulator 8, which sets the correct phase-state. The resulting PSK signal 10 is then amplified in the class E power amplifier 12, and transmitted.

Additionally, when required, an analogue low-speed pilot signal 14 can be fed to a DC bias voltage control circuit 16, amplitude modulating the PSK signal at a much lower bit rate. This additional low-speed signal could carry system-relevant information, e.g. authentication codes, base-station handover signals at cell boundaries, sensor readings, synchronisation signals, etc.

It should be understood that whilst the above prototype of the PSK circuit is described in terms of a QPSK transmitter, the above-described approach is not limited to a QPSK signal and could instead be extended to any PSK signal including BPSK, GMS signals etc.

Bearing the above in mind, a prototype GSM transmitter based on the improved class E amplifier was designed and tested as described in Section 5(a) [i.e. studies of the phase conformity of the improved class E amplifier]. The results of those tests are shown in FIG. 7 and demonstrate that the circuit preserves the phase relationships of the GSM signal.

(b) High-Speed N-state QAM Transmitter

In contrast with the traditional teachings regarding the amplification of a QAM signal, the discovery that it is possible to control the amplitude of the output signal from an improved class E power amplifier by varying its DC bias voltage, provides a new mechanism for amplifying a QAM signal.

Figure 10:
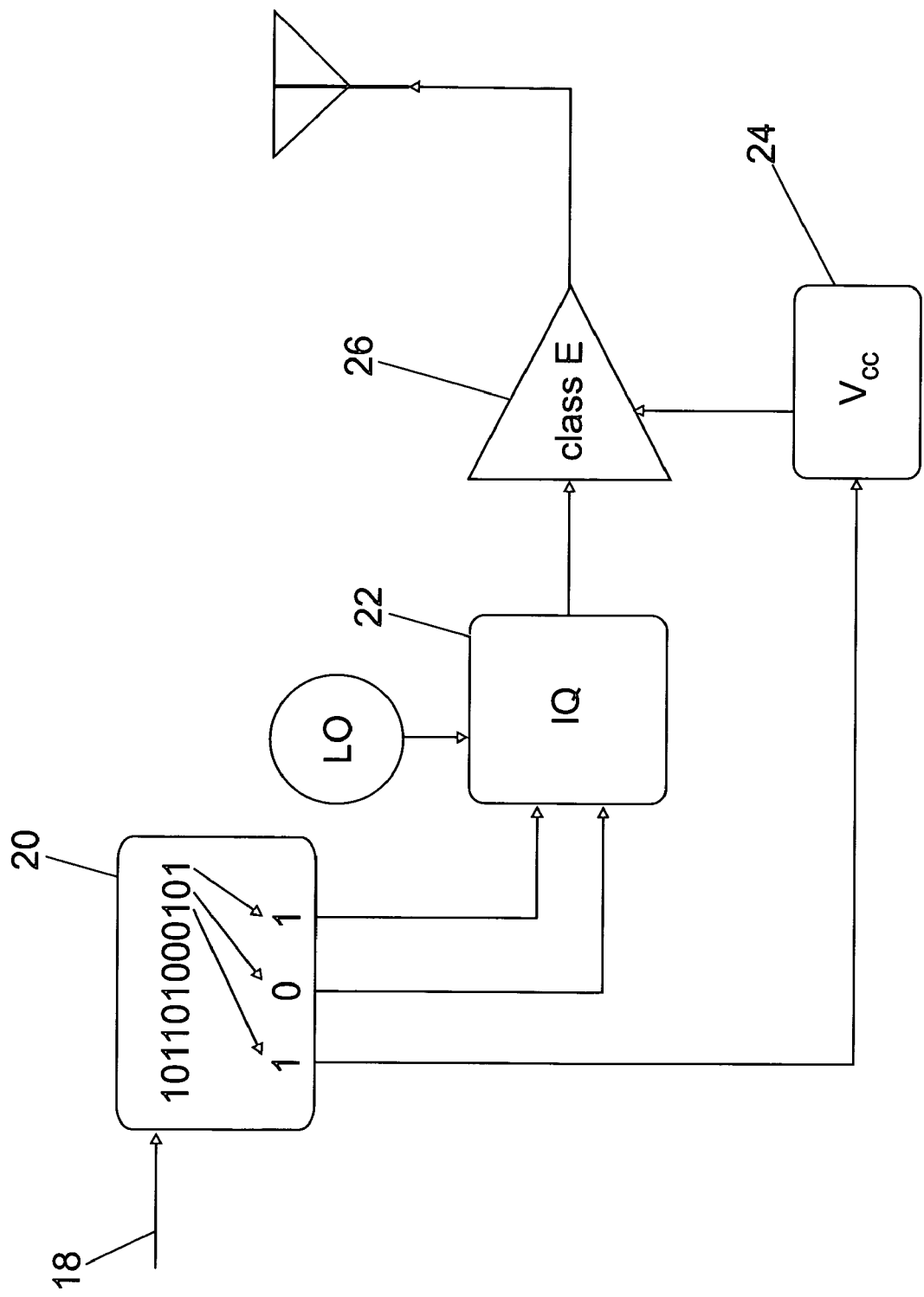
FIG. 10 is a circuit diagram for a N-state quadrature amplitude modulation (QAM) transmitter in accordance with a second embodiment of the invention.

FIG. 10 is a circuit diagram for a novel 8QAM transmitter topology based on the improved Class E power amplifier. A high speed incoming bit stream 18 is split by a bit splitter 20 into words of three consecutive bits. The first two bits in the word '101' (shown in FIG. 10), namely '1' and '0' are fed into a conventional IQ modulator 22, which controls the phase-state of the signal independently of its amplitude. The third bit of the word (namely '1' in FIG. 10) is fed to a DC bias voltage control circuit 24, which controls the amplitude state of the signal through the amplifier 26.

It should be recognised that whilst the above example relates to an 8QAM transmitter circuit, the QAM transmitter circuit employing the improved class E power amplifier is not restricted to an 8QAM signal. Whilst the present example applies only two bias levels to the active device, a QAM transmitter circuit based on the improved class E power amplifier could be developed for any level of QAM by applying more DC bias levels to the active device.

A prototype transmitter circuit for an 8QAM signal was designed using the previously described hybrid MIC class E amplifier. The prototype circuit was tested using an Anritsu MG 3660 A modulation generator to produce a 270 kbps PSK signal with a carrier frequency of 890 MHz, and an Anritsu MT 8801 B modulation analyser to receive the amplified signal. In addition, the DC power supply for the class E amplifier was switched at 9 kHz, amplitude modulating the PSK signal. For simplicity, the bias voltage switching signal and the PSK signal were not in any form synchronised to each other.

The switchable DC bias control for the class E amplifier was achieved by feeding a DC signal to one input port of a summing amplifier using two TL081 operational amplifiers (SGS-Thompson Microelectronics, "TL081, TL081A-TL081B." Datasheet, April Australia 1995) and feeding the logic signal to the other input port.

The output of the summing amplifier was then connected to the drain of the active device via the RF choke of the class E amplifier. Thus the DC bias voltage could be switched between two different non-zero DC values to vary the gain of the class E amplifier between two arbitrary values.

Figure 11:
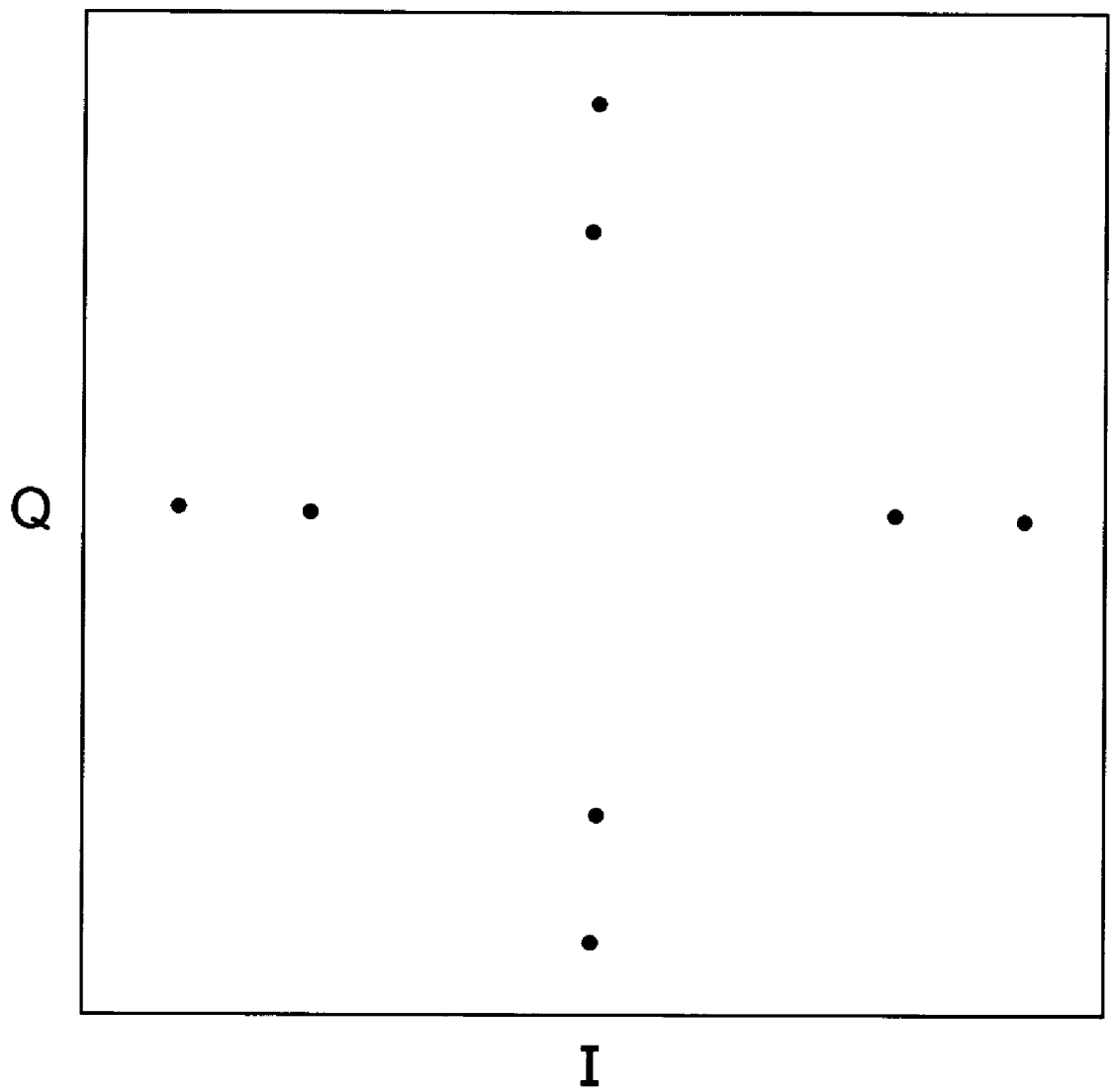
FIG. 11 is a constellation plot for a prototype 8QAM transmitter circuit in accordance with FIG. 10.

FIG. 11 shows the test results for the prototype circuit. From the constellation plot, it can be seen that the amplitude of the 8QAM signal varies with the DC bias. Whilst the measured phase error increased to 1.4° rms, and 3.6° peak it is believed that the additional phase noise comes from the DC bias switching. However, it is envisaged that the phase noise could be reduced by optimising the circuit design.

Improvements and modifications can be made to the above without departing from the scope of the invention.

The invention claimed is:

1. A phase shift keying signal transmission circuit comprising a phase shift keying modulator and a class E power amplifier, the class E power amplifier comprising an active device, a first inductor, a DC blocking element and an oscillating element driven by a voltage signal and comprising a parallel LC resonant circuit connected in parallel with the active device, wherein the first inductor is connected in series between the active device and the DC blocking element,
   wherein the phase shift keying signal transmission circuit incorporates an analogue signal source connectable to a class E power amplifier bias voltage control means so that the analogue signal source modulates the output from the phase shift keying modulator.

2. An amplitude modulated signal transmission circuit comprising an amplitude modulator and a class E power amplifier, the class E power amplifier comprising an active device, a first inductor, a DC blocking element and an oscillating element driven by a voltage signal and comprising a parallel LC resonant circuit connected in parallel with the active device, wherein the first inductor is connected in series between the active device and the DC blocking element,
   wherein the amplitude modulated signal transmission circuit comprises an input signal splitting means and a voltage control means wherein the input signal splitting means splits a digital input signal into a series of multiple bit words, wherein at least one bit of a resulting word is transmitted to the voltage control means to control the bias voltage of the class E power amplifier and wherein the remaining bits of the resulting word are transmitted to the amplitude modulator for amplification by the class E power amplifier.

3. A circuit as claimed in claim 1 wherein the class E power amplifier comprises a load resistor connected in parallel to the oscillating element.

4. A circuit as claimed in claim 3 wherein the oscillating element forces a sinusoidal voltage over the load resistor and the active device.

5. A circuit as claimed in claim 1 wherein the DC blocking element comprises a RF choke and a first capacitor.

6. A circuit as claimed in claim 1 wherein the active device is switched from an "ON" state in which the active device operates as a closed switch to an "OFF" state in which the active device operates as an open switch wherein the switching operation is controlled by an RF signal.

7. A circuit as claimed in claim 6 wherein the switching activity of the active device stimulates a sinusoidal voltage in the oscillating element.

8. A circuit as claimed in claim 7 wherein when the active device is in its "ON" state, a current flows through the switch and the sinusoidal voltage developed in the oscillating element is dropped across the load resistor.

9. A circuit as claimed in claim 6 wherein when the active device is in its "OFF" state, a current flows through the load resistor and the voltage developed by the oscillating element is dropped exclusively across the active device.

10. A circuit as claimed in claim 2 wherein the class E power amplifier comprises a load resistor connected in parallel to the oscillating element.

11. A circuit as claimed in claim 10 wherein the oscillating element forces a sinusoidal voltage over the load resistor and the active device.

12. A circuit as claimed in claim 2 wherein the DC blocking element comprises a RF choke and a first capacitor.

13. A circuit as claimed in claim 2 wherein the active device is switched from an "ON" state in which the active device operates as a closed switch to an "OFF" state in which the active device operates as an open switch wherein the switching operation is controlled by an RF signal.

14. A circuit as claimed in claim 13 wherein the switching activity of the active device stimulates a sinusoidal voltage in the oscillating element.

15. A circuit as claimed in claim 14 wherein when the active device is in its "ON" state, a current flows through the switch and the sinusoidal voltage developed in the oscillating element is dropped across the load resistor.

16. A circuit as claimed in claim 13 wherein when the active device is in its "OFF" state, a current flows through the load resistor and the voltage developed by the oscillating element is dropped exclusively across the active device.

* * * * *